United States Patent
Kuo et al.

(10) Patent No.: US 11,709,235 B2
(45) Date of Patent: Jul. 25, 2023

(54) DATA REDUCTION TECHNIQUES IN A LIDAR SYSTEM

(71) Applicant: Analog Devices, Inc., Norwood, MA (US)

(72) Inventors: Shawn S. Kuo, Arlington, MA (US); Lijun Gao, Shoreview, MN (US)

(73) Assignee: Analog Devices, Inc., Norwood, MA (US)

( * ) Notice: Subject to any disclaimer, the term of this patent is extended or adjusted under 35 U.S.C. 154(b) by 514 days.

(21) Appl. No.: 16/989,179

(22) Filed: Aug. 10, 2020

(65) Prior Publication Data
US 2022/0043114 A1 Feb. 10, 2022

(51) Int. Cl.
*H03M 1/00* (2006.01)
*G01S 7/484* (2006.01)
*G01S 7/4861* (2020.01)
*G01S 17/08* (2006.01)
*H03M 1/18* (2006.01)
*G01S 7/481* (2006.01)
*G01S 7/487* (2006.01)

(52) U.S. Cl.
CPC ............ *G01S 7/484* (2013.01); *G01S 7/4861* (2013.01); *G01S 17/08* (2013.01); *H03M 1/18* (2013.01); *G01S 7/487* (2013.01); *G01S 7/4817* (2013.01)

(58) Field of Classification Search
CPC ........ G01S 7/484; G01S 7/4861; G01S 17/08; G01S 7/4817; G01S 7/487; H03M 1/18
See application file for complete search history.

(56) References Cited

U.S. PATENT DOCUMENTS

| 6,594,000 B2 | 7/2003 | Green et al. |
| 7,830,442 B2 | 11/2010 | Griffis et al. |
| 10,241,198 B2 | 3/2019 | Lachapelle et al. |
| 10,473,770 B1 * | 11/2019 | Zhu ...................... G01S 17/931 |
| 2018/0172440 A1 | 6/2018 | Zhou et al. |
| 2018/0284231 A1 | 10/2018 | Russell et al. |
| 2018/0373248 A1 | 12/2018 | Chornenky |
| 2019/0219674 A1 | 7/2019 | Tokmak et al. |
| 2020/0025883 A1 | 1/2020 | Stann et al. |

FOREIGN PATENT DOCUMENTS

| CN | 110850427 A | 2/2020 |
| DE | 202019103619 U1 | 12/2019 |
| EP | 2277060 B1 | 1/2013 |
| WO | WO-2018176288 A1 | 10/2018 |

OTHER PUBLICATIONS

Csomortani, Istvan, et al., "Open-Source LIDAR Prototyping Platform", AnalogDialog, 54(1), (Feb. 2020), 6 pgs.
Ma, Rui, et al., "A 66dB Linear Dynamic Range, 100dBOmega Transimpedance Gain TIA with High Speed PDSH for LiDAR", IEEE Transactions on Instrumentation and Measurement, 69(4), (Apr. 2019), 9 pgs.

* cited by examiner

*Primary Examiner* — Joseph J Lauture
(74) *Attorney, Agent, or Firm* — Schwegman Lundberg & Woessner, P.A.

(57) ABSTRACT

Techniques to adjust a gain of an analog-to-digital converter circuit (ADC) and/or an ADC full scale from one sample to the next of an analog input signal to compensate for the signal loss over distance, which can increase an effective dynamic range of the system. The benefit of compensating for the signal loss due to distance is that a data interface between the ADC of the receiver of the LIDAR system and a signal processor no longer needs to support the dynamic range from the range specification.

20 Claims, 4 Drawing Sheets

DATA REDUCTION TECHNIQUES IN A LIDAR SYSTEM

FIELD OF THE DISCLOSURE

This document pertains generally, but not by way of limitation, to systems for providing light detection and ranging (LIDAR).

BACKGROUND

Light detection and ranging (LIDAR) systems, such as automotive LIDAR systems, can operate by transmitting one or more pulses of light towards a target region. The one or more transmitted light pulses can illuminate a portion of the target region. A portion of the one or more transmitted light pulses can be reflected and/or scattered by an object in the illuminated portion of the target region and received by the LIDAR system. The LIDAR system can then measure a time difference between the transmitted and received light pulses, such as to determine a distance between the LIDAR system and the illuminated object. The distance can be determined according to the expression $$d = \frac{tc}{2},$$

where d can represent a distance from the LIDAR system to the illuminated object, t can represent a round trip travel time, and c can represent a speed of light.

LIDAR systems generally include at least two functional blocks. The first block is the transmitter, which is responsible for generating and transmitting the illumination and all related functionality. The second block is the receiver, which is responsible for detecting the reflected illumination. Further functions, for example system control and signal processing can be split between the transmitter and receiver, contained fully within one of the two, or exist as separate blocks in the LIDAR system.

SUMMARY OF THE DISCLOSURE

This disclosure is directed to, among other things, techniques to adjust a gain of an analog-to-digital converter circuit (ADC) and/or an ADC full scale from one sample to the next of an analog input signal to compensate for the signal loss over distance, which can increase an effective dynamic range of the ADC system. The benefit of compensating for the signal loss due to distance is that a data interface between the ADC of the receiver of the LIDAR system and a signal processor no longer needs to support the dynamic range from the range specification.

In some aspects, this disclosure is directed to an analog-to digital converter (ADC) system configured to compensate for a signal loss of a LIDAR system on a sample-by-sample basis to increase an effective dynamic range of the ADC system, the ADC system comprising: an ADC circuit configured to generate a representation of a light pulse; a digitally programmable digital gain stage coupled to an output of the ADC circuit or an ADC full scale adjustment circuit coupled to an input of the ADC circuit, the gain stage having a gain to modify the representation of the light pulse; and a control circuit configured to receive a trigger signal indicative of a laser firing instance and output a signal representing a gain setting to the digitally programmable gain stage circuit to adjust the gain or output a signal representing a full scale adjustment setting to the ADC full scale adjustment circuit to adjust a full scale value of the ADC circuit, wherein the gain setting and the full scale adjustment setting are based on an elapsed time from the laser firing instance.

In some aspects, this disclosure is directed to a method of compensating for a signal loss of a LIDAR system on a sample-by-sample basis to increase an effective dynamic range of an analog-to digital converter (ADC) system, the method comprising: generating, by an analog-to-digital converter (ADC) circuit, a representation of a light pulse; receiving a trigger signal indicative of a laser firing instance; and generating a signal representing a gain setting to adjust the gain of a digitally programmable gain stage circuit or a signal representing a full scale adjustment setting to adjust a full scale value of the ADC circuit, wherein the gain setting and the full scale adjustment setting are based on an elapsed time from the laser firing instance.

In some aspects, this disclosure is directed to an analog-to digital converter (ADC) system configured to compensate for a signal loss of a LIDAR system on a sample-by-sample basis to increase an effective dynamic range of the ADC system, the ADC system comprising: an ADC circuit configured to generate a representation of a light pulse; means for receiving a trigger signal indicative of a laser firing instance; and means for generating a signal representing a gain setting to adjust the gain of a digitally programmable gain stage circuit or a signal representing a full scale adjustment setting to adjust a full scale value of the ADC circuit, wherein the gain setting and the full scale adjustment setting are based on an elapsed time from the laser firing instance.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Time of flight LIDAR systems are commonly used to detect distance, infer velocity, and classify objects, which can be accomplished by transmitting light at an object and detecting the amount of time it takes to reflect off the object and return to the receiver. The delay between when the light was transmitted and when the return signal was received can be used to determine the distance. Multiple transmissions separated in time can be used to determine velocity. The amplitude and spatial distribution of return signals can be used to classify the object.

A fraction of the energy of the transmitted light reflects off an object and returns back to the receiver of the LIDAR system. The amount of energy received decreases the further away the object is from the receiver of the LIDAR system. The power received ($P_R$) in a LIDAR system is given by Equation 1 below:

$$P_R = P_T \frac{\sigma}{A_{illum}} \frac{A_{rec}}{\pi R^2} \eta_{atm}^2 \eta_{sys}, \qquad \text{Equation 1}$$

where $P_T$ is the transmit power, $\sigma$ is the effective cross section, $A_{illum}$ is the illuminated area, $A_{rec}$ is the receiver area, R is the range, $\eta_{atm}$ is the atmospheric transmission efficiency, and $\eta_{sys}$ is the receiver optical efficiency. In a typical system, transmitted power, atmospheric efficiency, and receiver efficiency are known quantities, either by system design or by changing slowly with time, such as atmospheric efficiency.

For most surfaces, light disperses in every direction uniformly to a first order. In addition, signal loss as a function of distance R is a known and repeatable quantity of $R^2$ for Lambertian surfaces. As such, the amount of energy that will be received by the receiver can be calculated. By modelling the signal loss that occurs over distance, the system can compensate for the signal loss.

Using various techniques of this disclosure, a gain of an analog-to-digital converter circuit (ADC) and/or an ADC full scale can be adjusted from one sample to the next of an analog input signal to compensate for the signal loss over distance, which can increase an effective dynamic range of the ADC system. The benefit of compensating for the signal loss due to distance is that a data interface between the ADC of the receiver of the LIDAR system and a signal processor no longer needs to support the dynamic range from the range specification.

For example, a LIDAR system supporting a minimum range of 10 meters (m) and a maximum range of 200 m corresponds to 8.5 extra bits per sample ((2*log 2(200 m/10 m))) that would need to be transferred across the data interface. By adjusting the gain on a sample-by-sample basis, the techniques of this disclosure can reduce the data rate of the link between an analog-to-digital converter (ADC) and a signal processor and reduce the power consumption.

Figure 1:
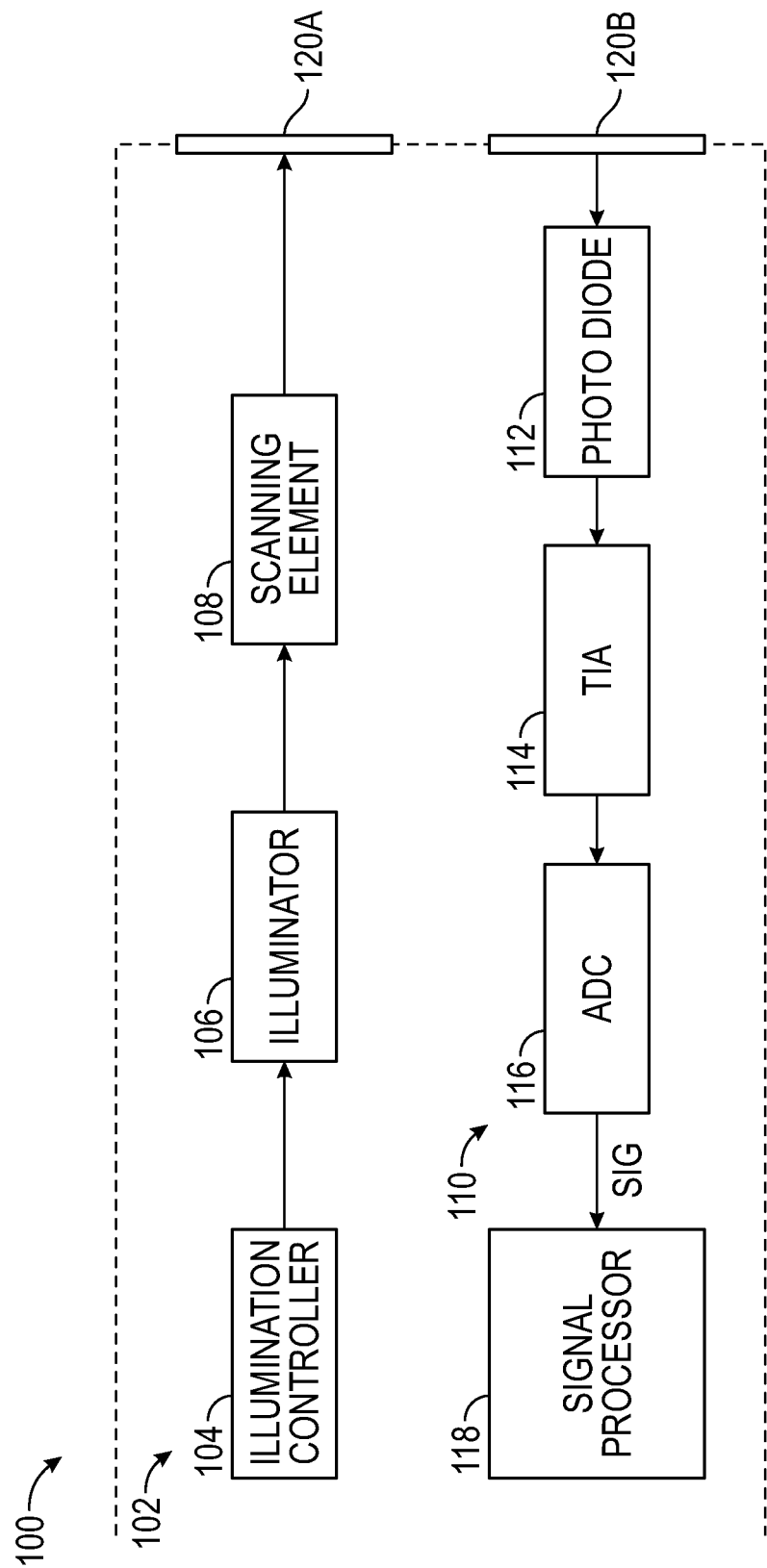
FIG. 1 illustrates an example of a system architecture and corresponding signal flow, such as for implementing a LIDAR system in accordance with various techniques of this disclosure.

FIG. 1 illustrates an example of a system architecture and corresponding signal flow, such as for implementing a LIDAR system in accordance with various techniques of this disclosure. The LIDAR system 100 can be a pulsed illumination LIDAR system.

The LIDAR system 100 can include a transmitter circuit 102 having an illumination controller circuit 104, an illuminator circuit 106, and an optional scanning element 108. The optional scanning element 108 can allow the system to scan through different regions-of-interest, for example.

The receiver circuit 110 can include a photodiode 112 coupled to a transimpedance amplifier (TIA) 114. The output of the TIA 114 can be digitized by an analog-to-digital (ADC) system 116. In some example configurations, there can be more than one combination of a photodiode 112, TIA 114, and ADC 116 coupled to a signal processor 118, such as an FPGA or ASIC.

In the example of FIG. 1, the illumination controller 104 can be coupled to the illuminator circuit 106 and can control the illumination output of the illuminator circuit 106 to direct infrared pulses of light to a first window 120A and to a detector or detector array of the receiver circuit, such as including the photodiode 112, via second window 120B. In some examples, the first window 120A and the second window 120B are the same window. In some examples, the photodiode 112 can be coupled to the scanning element 108 instead of the first or second window.

During operation, the illumination controller 104 can provide instructions to the illuminator circuit 106 and the optional scanning element 108, such as to cause the illuminator circuit 106 to emit a light beam towards the scanning element 108 and to cause the scanning element 108 to direct the light beam out the first window 120A and towards a target region that can include an object. In an example, the illuminator circuit 106 can include a laser and the scanning element. The scanning element can adjust an angle of the light beam based on the received instructions from the illumination controller 104. The scanning element can be an electro-optic waveguide, a MEMS mirror, a mechanical mirror, an optical phased array, or any other optical scanning device.

Light scattered or reflected by a target or object in a field-of-view (FOV) in response to a light pulse from the illuminator circuit 106 can be received through the second window 120B, such as through a receiver signal. For example, the received light can be detected by the photodiode 112, and a signal representative of the received light can be amplified by the TIA 114 and received by the ADC system 116.

The ADC system 116 can sample and store sequential samples of the signal representative of the received light. For example, the ADC system 116 can include an ADC circuit including a capacitor bank having a plurality of capacitors and the capacitor bank can receive and store charge representative of the samples. The ADC system 116 can then digitize the received samples and output the digital signal ("SIG") to the signal processor 118.

As described below, the ADC system 116 of the receiver circuit 110 can implement various techniques of this disclosure to reduce the data rate of the link between the ADC system 116 and the signal processor 118 and reduce the power consumption of the system 100.

Figure 2:
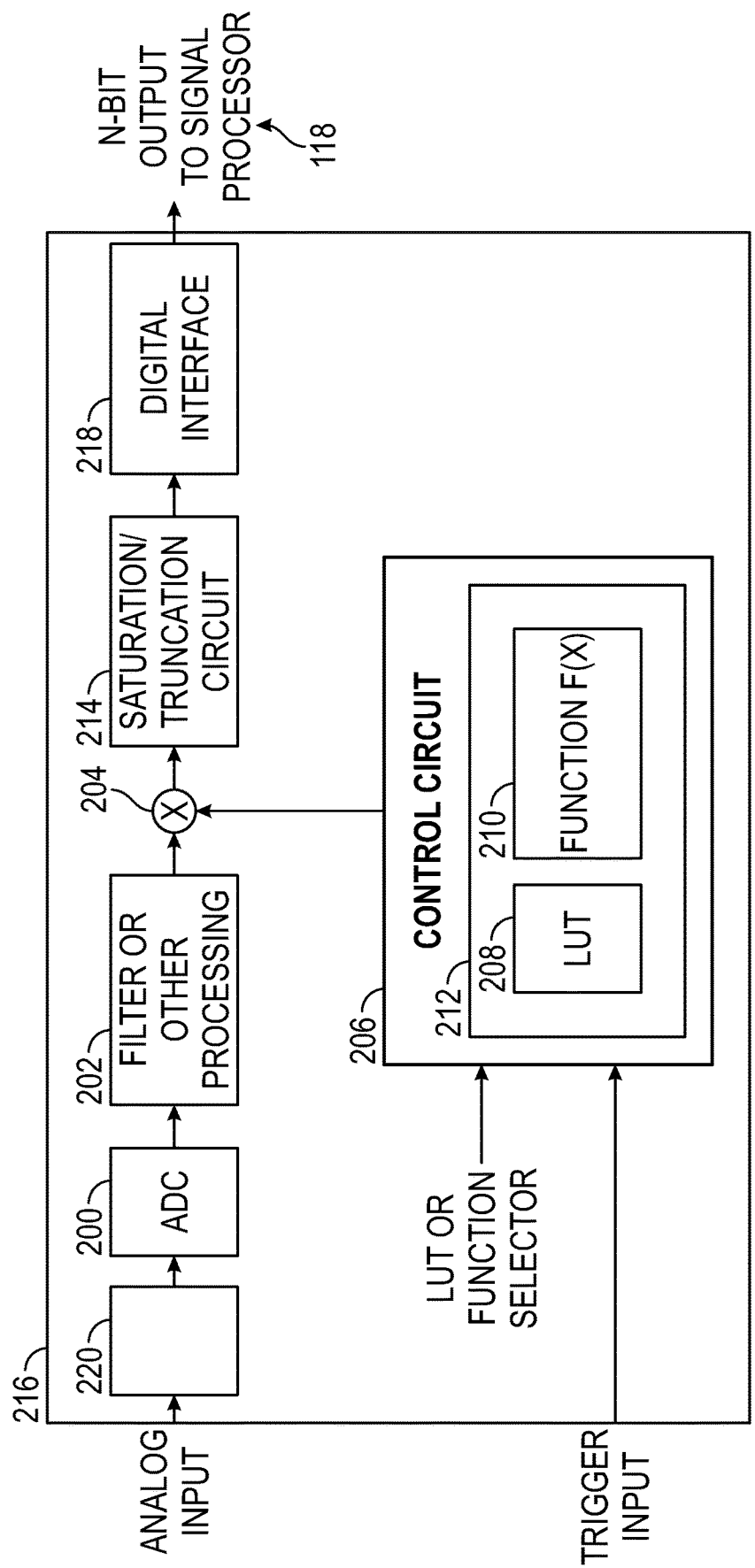
FIG. 2 is a block diagram of an example on ADC system that can implement various techniques of this disclosure.

FIG. 2 is a block diagram of an example on ADC system that can implement various techniques of this disclosure. In some examples, the ADC system 216 of FIG. 2 can be an example of the ADC system 116 of the receiver circuit 110 in the LIDAR system 100 of FIG. 1. The ADC system 216 can be configured to compensate for a signal loss of a LIDAR system on a sample-by-sample basis to increase an effective dynamic range of the ADC system.

The ADC system 216 of FIG. 2 can include an ADC signal conditioning circuit 220 to convert the input voltage, from the TIA 114 of FIG. 1, for example, into the required signal domain and swing required by an ADC circuit 200. In some implementations, the domain is voltage in which case the ADC signal conditioning circuit can include a buffer with the requisite gain to maximize ADC performance. In other implementations, the ADC signal conditioning circuit 220 is required to convert a voltage to a current or to a charge domain, in addition to properly setting the ADC full scale.

The ADC circuit 200, such as a successive approximation register (SAR) ADC circuit, can be configured to receive an analog input signal from the ADC signal conditioning circuit 220, and generate digital representations of samples of the analog input signal, such a light pulse. It should be noted that although the techniques of this disclosure are described for purposes of illustration with respect to light pulses and LIDAR systems, the techniques are not limited for use with light and LIDAR systems and can be used for with other signals and systems.

Filter circuitry, such as a matched filter to improve the signal-to-noise ratio (SNR), or other processing circuitry 202, can be coupled to the output of the ADC circuit 200.

In accordance with this disclosure, the ADC system 216 of FIG. 2 can include a digitally programmable digital gain stage 204 coupled to an output of the ADC circuit 200, such as directly or indirectly. In some examples, the digitally programmable digital gain stage 204 can be coupled directly to the output of the ADC circuit 200 (before the filter or other processing circuitry 202). In other examples, the digitally programmable digital gain stage 204 can be coupled indirectly to the output of the ADC circuit 200 (after the filter or other processing circuitry 202), such as shown in FIG. 2. The digitally programmable digital gain stage 204 has a gain to modify, e.g., amplify, the representation of the light pulse from the ADC circuit 200.

To modify the gain, the ADC system 216 can include a control circuit 206, such as a state machine, that can control, e.g., increase or decrease, the gain of the digitally programmable digital gain stage circuit 204. For example, the control circuit 206 can include a trigger input configured to receive a trigger signal indicative of a laser firing instance and output a signal representing a gain setting to the digitally programmable gain stage circuit 204. The gain setting determined by the control circuit 206 can be based on an elapsed time from the laser firing instance.

In some examples, the control circuit can include a stored data set 208, such as a look-up table (LUT), stored in a memory circuit 212, that includes data representing the gain setting with a corresponding elapsed time from the laser firing instance. The trigger signal received by the trigger input can provide an indication of the laser firing instance to the control circuit 206. The control circuit 206 can act as a counter and, based on the count, can determine a gain setting from the stored data set 208.

By way of a specific, non-limiting example for purposes of explanation, the control circuit 206 can determine that there were 2000 ADC samples between the laser firing instance and when the return signal was received. The control circuit 206 can use the stored data set 208 to determine a gain setting that corresponds with that particular sample, e.g., the $2000^{th}$ ADC sample, and output a signal representing a gain setting to the digitally programmable gain stage circuit 204. In this manner, the ADC system 216 can adjust the gain on a sample-by-sample basis. For example, the gain setting can act as a gain multiplier.

In some examples, rather than storing data representing a gain setting with a corresponding elapsed time from the laser firing instance, the stored data set can include a series of data representing the gain settings with the time being implied in the data.

By adjusting the gain on a sample-by-sample basis, the techniques of this disclosure can reduce the data rate of the link between the ADC system 216 and a signal processor, such as the signal processor 118 of FIG. 1, and reduce the power consumption. For example, a small dynamic range is needed for a return signal reflected from an object at close range, and the return signal is near full scale amplitude. For such a return signal, the ADC system 216 only needs to transmit a subset of the bits that define the resolution of the ADC system. As a non-limiting example, only the four most significant bits of an 8-bit ADC system are needed for a return signal of an object at close range.

However, for an object that is far away, the same dynamic range is needed but a much smaller amplitude is available to recover the signal. For such a return signal, the ADC system 216 needs to transmit many or even all of the bits that define the resolution of the ADC system. As a non-limiting example, all eight bits of an 8-bit ADC system may be needed for a return signal of an object that is far away.

By adjusting the gain on a sample-by-sample basis using the techniques of this disclosure, the ADC system 216 can treat the return signal of an object that is far away like the return signal of an object at close range by transmitting only a subset of the bits that define the resolution of the ADC system rather than many or all of the bits. In this manner, the techniques of this disclosure can reduce the data rate of the link between the ADC system 216 and the signal processor 118.

Reducing the data rate can reduce the power consumption of the system 100 because data transmission for a high speed system is power intensive. In any ADC system, the effective number of bits in the ADC system is generally calculated as the signal divided by the total noise in the ADC. This noise is generally white and evenly spread across the whole frequency spectrum of the ADC. Most signals are generally band limited signals and therefore the SNR of these signals can improve by filtering out the noise that is not in the frequency band of interest, thereby increasing the effective number of bits in the ADC.

Sending the data for the full dynamic range of the ADC can be a waste of power. As an example, the data interface for JESD204B high speed interface standard is about 10 pJ/bit, or about a 100 mW link at 10 Gbps. For an 8-bit ADC operating at 1 GSPS, this link power can be significant relative to the ADC power. Thus, reducing the data required for transfer across the interface link can be valuable to reducing the overall system power.

In some examples, rather than use a stored data set 208 that relates the elapsed time from the laser firing instance and a gain setting, the control circuit 206 can determine a gain setting using a mathematical relationship stored in the memory circuit 212, such as a function F(x) 210, between the gain setting and the elapsed time from the laser firing instance. For example, the gain setting can act as a gain multiplier. The mathematical relationship can represent what a transfer function should look like over time. In some such examples, using a stored data set, such as a LUT or a stored mathematical relationship, such as a function F(x), can provide either a fine programmable gain or a coarse bit shifting technique.

In some implementations, the mathematical relationship can be hard-coded in the control circuit 206 rather than stored in the memory circuit 212. Whether hard-coded or stored in the memory circuit, the control circuit 206 can store the mathematical relationship between the gain setting and the elapsed time from the laser firing instance.

In some examples, the ADC system 216 can include multiple control circuits 206, e.g., multiple state machines, with each control circuit 206 configured to operate in a specific environment. The ADC system 216 can include multiple LUT or functions to compensate for different environments such as retroreflectors, Lambertian returns, and changes in atmospheric conditions, such as fog. At the system level, information about the scene, such as where the retroreflectors are located, can be used by the control circuit 206 to select between multiple LUTs 208 and/or multiple functions 210. For example, the system can detect a change in an atmospheric condition and can generate a LUT or function selector signal as input to the control circuit 206. The control circuit 206 can then select a LUT 208 and or a function 210 from a group of LUTs 208 and/or a group of functions 210.

The gain setting and the elapsed time from the laser firing instance can be related exponentially, polynomially, quadratically, or logarithmically, for example. As an example of a function to compensate for gain differences on a sample-by-sample basis based on a Lambertian reflectance, gain(t) $=t^2$, where t is the elapsed time from the laser firing instance.

The trigger signal received by the trigger input can provide an indication of the laser firing instance to the control circuit 206. The control circuit 206 can act as a counter and, based on the count, can determine a gain setting.

By way of a specific, non-limiting example for purposes of explanation, the control circuit 206 can determine that there were 2000 ADC samples between the laser firing instance and when the return signal was received. The control circuit 206 can use the relationship stored in the memory circuit 212, such as a function F(x) 210, to determine a gain setting that corresponds with that particular sample, e.g., the $2000^{th}$ ADC sample, and output a signal representing a gain setting to the digitally programmable gain stage circuit 204. In this manner, the ADC system 216 can adjust the gain on a sample-by-sample basis.

In other examples, rather than adjusting the gain on a sample-by-sample basis, a fixed gain setting can be used for particular time ranges. For example, samples 1-500 can use a first gain setting, samples 501-1000 can use a second gain setting, samples 1001-1500 can use a third gain setting, and so forth.

In some examples, specific transfer functions can be defined for particular ranges. For example, samples 1-500 can use a first function $F_1(x)$, samples 501-1000 can use a second function $F_2(x)$, samples 1001-1500 can use a third function $F_3(x)$, and so forth. In some examples, the transfer functions can be piecewise functions.

In some examples, the digitally programmable gain stage circuit 204 can include a shift register. The signal representing the gain setting received by the digitally programmable gain stage circuit 204 can cause the shift register to bit shift the representation of the light pulse. Bit shifting can change the gain by a factor of two; the gain can double (or halve) each shift. In some such examples, bit shifting can provide a coarse programmable gain.

In some examples, the ADC system 216 can include a saturation/truncation circuit 214. The saturation/truncation circuit 214 can perform saturation detection and truncation to reduce the number of bits that go out the digital interface 218 and to the signal processor. Continuing the non-limiting example from above, if the ADC circuit 200 has an 8-bit resolution and only four bits of the sample are needed, the saturation/truncation circuit 214 can truncate the last four bits and transmit only the four needed bits. In this manner, the saturation/truncation circuit 214 can reduce a number of bits transmitted by the digital interface. If the saturation/truncation circuit 214 determines that saturation has occurred, the saturation/truncation circuit 214 can set the signal to either to positive full scale or negative full scale depending on whether a positive excursion event or negative excursion event occurred, respectively.

As indicated above, the control circuit 206 can include a trigger input configured to receive a trigger signal indicative of a laser firing instance. The trigger signal can be a copy of the signal that the illuminator controller 104 sends to the illuminator 106 to begin the transmission of light. In other words, the trigger signal can be based on a signal that initiates a light signal transmitted towards an object. When this trigger signal is received, control circuit 206, e.g. a state machine, can execute the time dependent gain as described previously, such as using a LUT or mathematical relationship.

The trigger signal need not be an external signal. In some implementations, the signal can be embedded within the data stream of the received signal. When a known pattern is detected, the state machine gain adjustment can begin. For example, in a monostatic LIDAR system, some of the transmitted light pulse can be reflected onto the receiver because the transmitter and receiver can use the same window 120A, 120B. When this reflection is detected, the receiver circuit can trigger the control circuit 206, e.g., a state machine, for the time dependent gain as described previously, such as using a LUT or mathematical relationship. In such a configuration, a delay can be added in the receive path to account for the time of a return signal.

In addition to the techniques described above for adjusting a gain of an ADC circuit on a sample-by-sample basis, such as in a receiver path of a LIDAR system, this disclosure describes techniques for adjusting an ADC full scale from one sample of an analog input signal to the next sample of the analog input signal to compensate for the signal loss over distance, which can increase an effective dynamic range of the ADC system.

Figure 3:
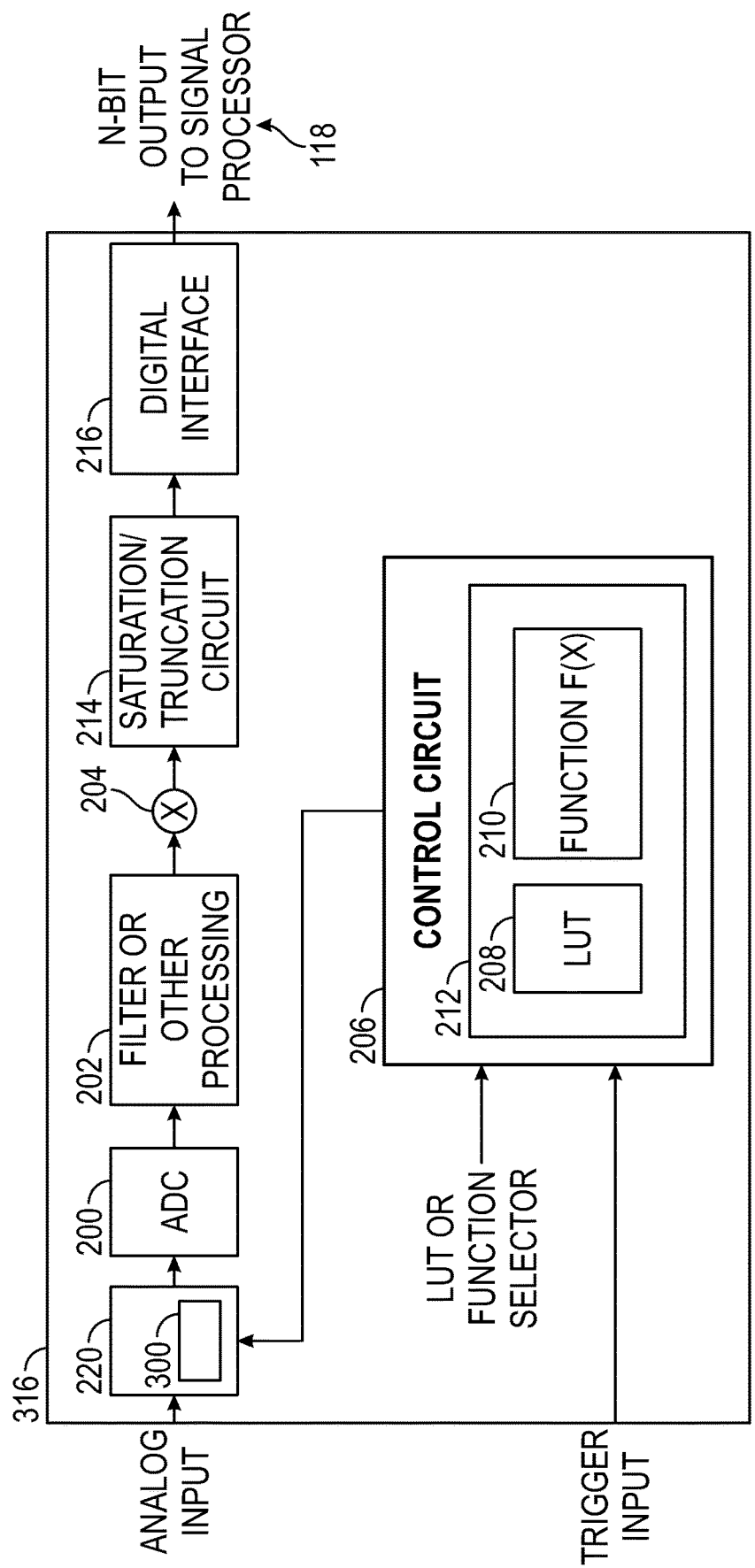
FIG. 3 is a block diagram of an example on ADC system that can implement various techniques of this disclosure.

FIG. 3 is a block diagram of an example on ADC system that can implement various techniques of this disclosure. In some examples, the ADC system 216 of FIG. 2 can be an example of the ADC system 116 of the receiver circuit 110 in the LIDAR system 100 of FIG. 1. Some of the components in FIG. 3 are similar to components in FIG. 2 and are labeled with similar reference numbers and, for purposes of conciseness, will not be described again. The ADC system 316 can be configured to compensate for a signal loss of a LIDAR system on a sample-by-sample basis to increase an effective dynamic range of the ADC system.

In contrast to the techniques in FIG. 2 in which the control circuit 206 can output a signal representing a gain setting to the digitally programmable gain stage circuit 204, the control circuit 206 of the ADC system 316 in FIG. 3 can output a signal representing a full scale adjustment to an ADC full scale adjustment circuit 300. The ADC full scale adjustment circuit 300 can be a part of the ADC signal conditioning circuit 220 and can be coupled to an input of the ADC circuit 200 to adjust a full scale value of the ADC circuit 200, where the full scale adjustment setting is based on an elapsed time from the laser firing instance. In some implementations, the techniques of FIGS. 2 and 3 can be combined such that a control circuit of the ADC system can output either or both a signal representing a gain setting to a digitally programmable gain stage circuit and output a signal representing a full scale adjustment setting to a ADC full scale adjustment circuit of the ADC circuit to adjust a full scale value of the ADC circuit.

Figure 4:
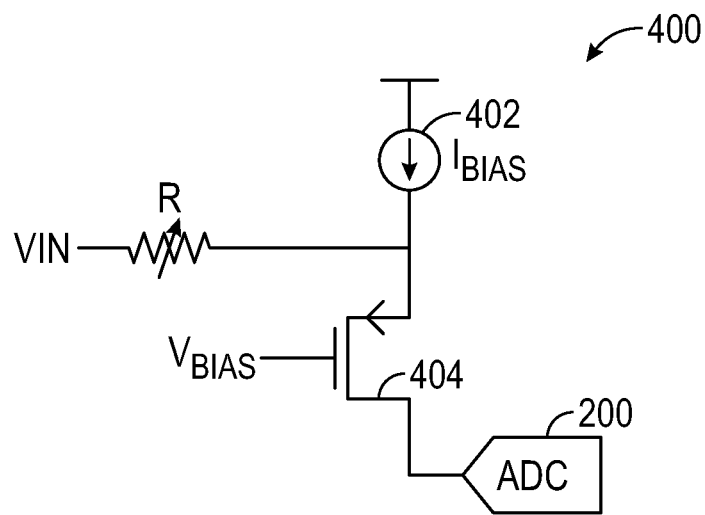
FIG. 4 is an example of an ADC full scale adjustment circuit that can implement various techniques of this disclosure.

FIG. 4 is an example of an ADC full scale adjustment circuit that can implement various techniques of this disclosure. The ADC full scale adjustment circuit 400 of FIG. 4 can include a current source 402 and a transistor 404 coupled to an input of the ADC circuit 200, where the current source 402 can provide a bias current $I_{BIAS}$ and the transistor is controlled by a bias voltage $V_{BIAS}$. In some examples, the ADC full scale adjustment circuit 400 of FIG. 4 can include a variable resistance component R, such as variable resistor or a transistor, coupled to the analog input signal $V_{IN}$ that can be adjusted on a sample-by-sample basis by the control circuit 206 of FIG. 3, for example, to adjust a full scale value of the ADC circuit 200.

To adjust the full scale value of the ADC circuit 200, the ADC system 316 of FIG. 3 can include a control circuit 206, such as a state machine, that can control, e.g., increase or decrease, the value of the variable resistance component R to adjust the full scale value of the ADC circuit 200. For example, the control circuit 206 can include a trigger input configured to receive a trigger signal indicative of a laser firing instance and output a signal representing a full scale adjustment setting to an ADC full scale adjustment circuit, such as the ADC full scale adjustment circuit 400 of FIG. 4, to adjust the value of the variable resistance component R, which adjusts a full scale value of the ADC circuit 200. For example, if the value of R is halved, then the ADC full scale setting halves in voltage, and if the value of R is doubled, then the ADC full scale setting doubles in voltage. In this manner, the signal representing the full scale adjustment is a code configured to adjust, e.g., attenuate, a resistor current to the ADC circuit 200. The ADC full scale adjustment setting determined by the control circuit 206 can be based on an elapsed time from the laser firing instance.

In some examples, the control circuit can include a stored data set 208, such as a look-up table (LUT), stored in a memory circuit 212, that includes data representing the ADC full scale adjustment setting with a corresponding elapsed time from the laser firing instance. The trigger signal received by the trigger input can provide an indication of the laser firing instance to the control circuit 206. The control circuit 206 can act as a counter and, based on the count, can determine an ADC full scale setting from the stored data set 208.

In some examples, rather than storing data representing an ADC full scale adjustment setting with a corresponding elapsed time from the laser firing instance, the stored data set can include a series of data representing the ADC full scale adjustment settings with the time being implied in the data.

In some examples, rather than use a stored data set 208 that relates the elapsed time from the laser firing instance and an ADC full scale adjustment setting, the control circuit 206 can determine an ADC full scale setting using a mathematical relationship stored in the memory circuit 212, such as a function F(x) 210, between the ADC full scale value and the elapsed time from the laser firing instance. The mathematical relationship can represent what a transfer function should look like over time, as described above.

In some implementations, the mathematical relationship can be hard-coded in the control circuit 206 rather than stored in the memory circuit 212. Whether hard-coded or stored in the memory circuit, the control circuit 206 can store the mathematical relationship between the gain setting and the elapsed time from the laser firing instance.

Figure 5:
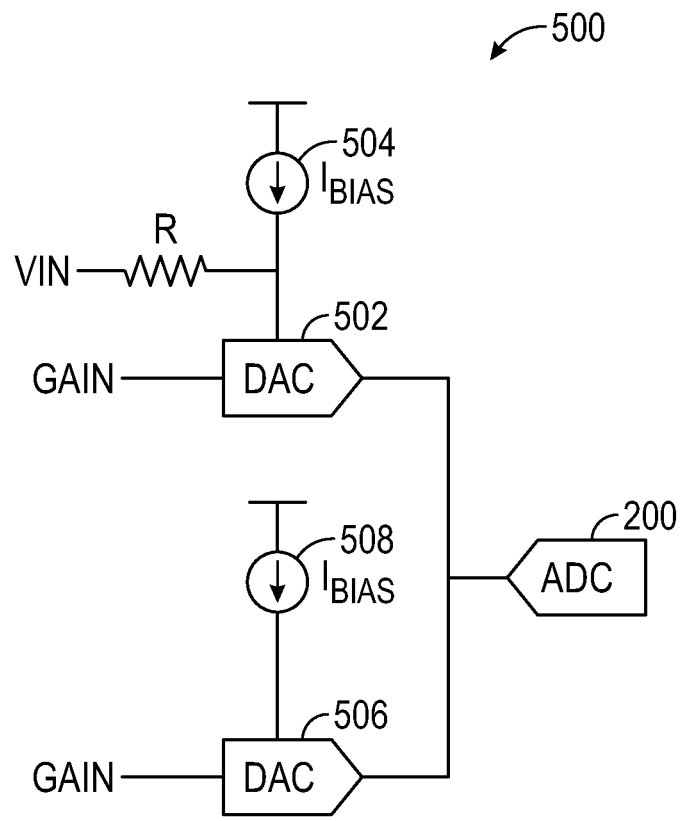
FIG. 5 is another example of an ADC full scale adjustment circuit that can implement various techniques of this disclosure.

FIG. 5 is another example of an ADC full scale adjustment circuit that can implement various techniques of this disclosure. Rather than use a variable resistance component R to adjust a full scale value of the ADC circuit 200 of FIG. 3, as shown in the ADC full scale adjustment circuit 400 of FIG. 4, the full scale adjustment can be performed using a digital-to-analog converter (DAC) circuit, as shown in ADC full scale adjustment circuit 500 of FIG. 5. By changing a DAC code, based on a signal from a control circuit, such as control circuit 206 of FIG. 3, the ADC full scale value of the ADC circuit 200 of FIG. 3 can be adjusted on a sample-by-sample basis. The ADC full scale adjustment circuit 500 of FIG. 5 is an example of the ADC full scale adjustment circuit 300 of FIG. 3.

The ADC full scale adjustment circuit 500 of FIG. 5 can include a first DAC circuit 502 coupled to a current source 504 and to a resistor R. The resistor R is coupled to the analog input signal $V_{IN}$. The first DAC circuit 502 is further configured to receive a gain signal. The output of the first DAC circuit 502 is coupled to an ADC circuit, such as ADC circuit 200. The current source 504 can provide a bias current $I_{BIAS}$ to the first DAC circuit 502.

The ADC full scale adjustment circuit 500 of FIG. 5 can further include a second DAC circuit 506 coupled to a current source 508. The second DAC circuit 506 is further configured to receive a gain signal, which is the complement of the gain signal applied to the first DAC circuit 502. The output of the second DAC circuit 506 is coupled to the ADC circuit, such as ADC circuit 200. The current source 508 can provide a bias current $I_{BIAS}$ to the second DAC circuit 506.

Each DAC circuit 502, 506 can include a DAC cell having a differential pair of transistors. DAC circuits of any resolution can be created by segmenting DAC cells into binary and/or thermometer weighted sections. Although depicted as being single-ended, these techniques can be extended to a differential implementation.

The first and second DAC circuits 502, 506 can maintain the ADC bias current while switching the ADC input full scale. Using various techniques of this disclosure, the ADC full scale adjustment circuit 500 of FIG. 5 can receive DAC codes from a control circuit, such as the control circuit 206 of FIG. 3, that can be adjusted on a sample-by-sample basis by the control circuit to adjust a full scale adjustment setting of the ADC circuit 200. In some DAC implementations, the DAC can be switched faster than the ADC sample rate.

To adjust the full scale value of the ADC circuit 200, the ADC system 316 of FIG. 3 can include a control circuit 206, such as a state machine, that can generate and apply a DAC code to the first and second DAC circuits 502, 506 of the ADC full scale adjustment circuit 500 of FIG. 5 to adjust the full scale adjustment setting of the ADC circuit 200. For example, the control circuit 206 can include a trigger input configured to receive a trigger signal indicative of a laser firing instance and output a signal representing a DAC code to an ADC full scale adjustment circuit, such as the ADC full scale adjustment circuit 500 of FIG. 5, to adjust, e.g., attenuate, the amount of the resistor current that reaches the ADC circuit 200. Changing the DAC code can change the input current from the resistor R to the ADC core by turning ON and OFF switches based on the DAC code. For example, a first DAC code can halve the ADC full scale setting, and a second DAC code and double the ADC full scale setting. The ADC full scale setting determined by the control circuit 206 can be based on an elapsed time from the laser firing instance.

In some examples, the control circuit can include a stored data set 208, such as a look-up table (LUT), stored in a memory circuit 212, that includes data representing the ADC full scale setting with a corresponding elapsed time from the laser firing instance. The trigger signal received by the trigger input can provide an indication of the laser firing instance to the control circuit 206. The control circuit 206 can act as a counter and, based on the count, can determine an ADC full scale setting from the stored data set 208.

In some examples, rather than use a stored data set 208 that relates the elapsed time from the laser firing instance and an ADC full scale setting, the control circuit 206 can determine an ADC full scale value using a mathematical relationship stored in the memory circuit 212, such as a function F(x) 210, between the ADC full scale setting and the elapsed time from the laser firing instance. The mathematical relationship can represent what a transfer function should look like over time, as described above.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The invention claimed is:

1. An analog-to digital converter (ADC) system configured to compensate for a signal loss of a LIDAR system on a sample-by-sample basis to increase an effective dynamic range of the ADC system, the ADC system comprising:
   an ADC circuit configured to generate a representation of a light pulse;
   a digitally programmable digital gain stage coupled to an output of the ADC circuit or an ADC full scale adjustment circuit coupled to an input of the ADC circuit, the gain stage having a gain to modify the representation of the light pulse; and
   a control circuit configured to receive a trigger signal indicative of a laser firing instance and output a signal representing a gain setting to the digitally programmable gain stage circuit to adjust the gain or output a signal representing a full scale adjustment setting to the ADC full scale adjustment circuit to adjust a full scale value of the ADC circuit, wherein the gain setting and the full scale adjustment setting are based on an elapsed time from the laser firing instance.

2. The ADC system of claim 1, comprising:
   the digitally programmable digital gain stage.

3. The ADC system of claim 2, wherein the digitally programmable gain stage circuit includes a shift register, and wherein the signal representing the gain setting causes the shift register to bit shift the representation of the light pulse.

4. The ADC system of claim 2, wherein the control circuit includes a memory circuit that includes a stored data set, and wherein the stored data set includes a series of data representing the gain settings.

5. The ADC system of claim 2, wherein the control circuit stores a representation of a relationship between the gain setting and the elapsed time from the laser firing instance.

6. The ADC system of claim 2, comprising:
   a trigger input configured to receive the trigger signal, wherein the trigger signal is embedded within a light signal transmitted towards an object.

7. The ADC system of claim 2, comprising:
   a trigger input configured to receive the trigger signal, wherein the trigger signal is based on a signal that initiates a light signal transmitted towards an object.

8. The ADC system of claim 2, comprising:
a digital interface coupled to a signal processor; and
a truncation circuit configured to reduce a number of bits transmitted by the digital interface.

9. The ADC system of claim 1, comprising:
the ADC full scale adjustment circuit.

10. The ADC system of claim 9, wherein the ADC full scale adjustment circuit includes a variable resistance component, and wherein the signal representing the full scale adjustment is configured to adjust a resistance of the variable resistance component.

11. The ADC system of claim 9, wherein the ADC full scale adjustment circuit includes at least one digital-to-analog converter (DAC) circuit, and wherein the signal representing the full scale adjustment is a code configured to attenuate a resistor current to the ADC circuit.

12. The ADC system of claim 9, wherein the control circuit includes a memory circuit that includes a stored data set, and wherein the stored data set includes a series of data representing the full scale adjustment settings.

13. The ADC system of claim 9, wherein the control circuit stores a representation of a relationship between the full scale adjustment setting and the elapsed time from the laser firing instance.

14. A method of compensating for a signal loss of a LIDAR system on a sample-by-sample basis to increase an effective dynamic range of an analog-to digital converter (ADC) system, the method comprising:
generating, by an analog-to-digital converter (ADC) circuit, a representation of a light pulse;
receiving a trigger signal indicative of a laser firing instance; and
generating a signal representing a gain setting to adjust the gain of a digitally programmable gain stage circuit or a signal representing a full scale adjustment setting to adjust a full scale value of the ADC circuit, wherein the gain setting and the full scale adjustment setting are based on an elapsed time from the laser firing instance.

15. The method of claim 14, comprising:
generating the signal representing the gain setting to adjust the gain of the digitally programmable gain stage circuit.

16. The method of claim 14, comprising:
generating the signal representing the full scale adjustment setting to adjust the full scale value of the ADC circuit.

17. The method of claim 16, comprising:
attenuate a resistor current of an ADC full scale adjustment circuit based on the signal representing the full scale adjustment setting.

18. The method of claim 16, wherein generating the signal representing the full scale adjustment setting to adjust the full scale value of the ADC circuit includes:
generating a digital-to-analog converter (DAC) code DAC representing the full scale adjustment setting to adjust the full scale value of the ADC circuit.

19. An analog-to digital converter (ADC) system configured to compensate for a signal loss of a LIDAR system on a sample-by-sample basis to increase an effective dynamic range of the ADC system, the ADC system comprising:
an ADC circuit configured to generate a representation of a light pulse;
means for receiving a trigger signal indicative of a laser firing instance; and
means for generating a signal representing a gain setting to adjust the gain of a digitally programmable gain stage circuit or a signal representing a full scale adjustment setting to adjust a full scale value of the ADC circuit, wherein the gain setting and the full scale adjustment setting are based on an elapsed time from the laser firing instance.

20. The ADC system of claim 19, comprising:
a trigger input configured to receive the trigger signal, wherein the trigger signal is embedded within a light signal transmitted towards an object.

* * * * *